US006582886B1

(12) United States Patent
Hendrickson et al.

(10) Patent No.: US 6,582,886 B1
(45) Date of Patent: Jun. 24, 2003

(54) DEVELOPING SOLVENT FOR PHOTOPOLYMERIZABLE PRINTING PLATES

(75) Inventors: Constance Marie Hendrickson, Irving, TX (US); David Calvin Bradford, Winston Salem, NC (US)

(73) Assignee: NuPro Technologies, Inc., Winston Salem, NC (US)

( * ) Notice: Subject to any disclaimer, the term of this patent is extended or adjusted under 35 U.S.C. 154(b) by 0 days.

(21) Appl. No.: 09/993,912

(22) Filed: Nov. 27, 2001

(51) Int. Cl.[7] ................................................ G03F 7/30
(52) U.S. Cl. ........................................................ 430/294
(58) Field of Search ........................................... 430/294

(56) References Cited

U.S. PATENT DOCUMENTS

| 4,177,074 A | 12/1979 | Proskow | 430/286 |
|---|---|---|---|
| 4,323,636 A | 4/1982 | Chen | 430/271 |
| 4,323,637 A | 4/1982 | Chen et al. | 430/271 |
| 4,369,246 A | 1/1983 | Chen et al. | 430/306 |
| 4,423,135 A | 12/1983 | Chen et al. | 430/271 |
| 4,517,279 A | 5/1985 | Wrons | 430/286 |
| 4,539,287 A | 9/1985 | Grossa et al. | 430/300 |
| 4,806,452 A | 2/1989 | Hoffmann et al. | 430/306 |
| 4,847,182 A | 7/1989 | Worns et al. | 430/309 |
| 5,041,360 A | 8/1991 | Schlosser | 430/309 |
| 5,240,815 A | 8/1993 | Telser et al. | 430/306 |
| 5,340,495 A | 8/1994 | Mulcahy et al. | 252/162 |
| 5,814,163 A | 9/1998 | Wojcik | 134/39 |
| 5,856,066 A | 1/1999 | Yoshida et al. | 430/309 |
| 6,090,769 A * | 7/2000 | Vlasblom | 510/365 |
| 6,096,699 A * | 8/2000 | Bergemann et al. | 510/201 |
| 6,191,087 B1 | 2/2001 | Opre et al. | 510/201 |
| 6,248,502 B1 | 6/2001 | Eklunk | 430/300 |
| 6,280,901 B1 | 8/2001 | Aviram et al. | 430/270 |
| 6,291,417 B1 * | 9/2001 | Flynn et al. | 510/412 |
| 6,306,555 B1 | 10/2001 | Schulz et al. | 430/270.1 |
| 6,495,074 B1 * | 12/2002 | Carr | 264/36.18 |

FOREIGN PATENT DOCUMENTS

GB        1 358 062        6/1974

* cited by examiner

*Primary Examiner*—Hoa Van Le
(74) *Attorney, Agent, or Firm*—Blank Rome LLP

(57) ABSTRACT

Flexographic printing plates are produced by exposing the photopolymer plates to a light source and washing out (developing) the masked out, non-exposed areas with a solvent. The invention provides methyl ester solvents suitable for use in the development of photopolymer printing plates. The solvents, which include methyl esters alone or mixed with co-solvents and/or non-solvents, are effective in developing a large number of different photopolymer printing plates and can produce images superior to those obtained with commercially available solvents currently used in such applications.

16 Claims, No Drawings

DEVELOPING SOLVENT FOR PHOTOPOLYMERIZABLE PRINTING PLATES

FIELD OF THE INVENTION

The present invention relates to an improved solvent and process for the production of flexographic printing plates crosslinked by photopolymerization. More specifically, the invention relates to a solvent system using methyl esters, alone or in combination with co-solvents and/or non-solvents, as washout solvents for the unpolymerized material in the printing plates to develop a relief image and a method for developing printing plates.

BACKGROUND OF THE INVENTION

Washout processes for the development of photopolymerizable flexographic printing plates are well known and is described in detail in U.S. Pat. No. 5,240,815 which is incorporated herein by reference. Ordinarily, exposed plates are washed (developed) in a developing solvent that can remove the unpolymerized material while leaving the polymerized (cured) material intact. The solvent typically used in such processes include: (a) chlorohydrocarbons, such as trichloroethylene, perchloroethylene or trichloroethane, alone or in a mixture with a lower alcohol, such as n-butanol; (b) saturated cyclic or acyclic hydrocarbons, such as petroleum ether, hexane, heptane, octane, cyclohexane or methylcyclohexane; (c) aromatic hydrocarbons, such as benzene, toluene or xylene; (d) lower aliphatic ketones, such as acetone, methyl ethyl ketone or methyl isobutyl ketone; and (e) terpene hydrocarbons, such as d-limonene.

One important disadvantage of the known solvents and the procedures for their use is that the solvents being used as developers may act too slowly, cause swelling of the plates and/or cause damage to the fine detail in the plate by undercutting and/or pinholing. Moreover, when non-chlorinated solvents are used in the washout process, long drying times may be necessary. Furthermore, many of these solvents have flashpoints of less than 100° F., so that the process can only be operated in special, explosion-protected plants. Many of the prior art solvents are considered Hazardous Air Pollutants (HAPS), and are subject to stringent reporting requirements. When chlorohydrocarbons and other toxic chemicals are used, their toxicity also gives rise to disposal problems and worker safety issues.

An essential step to any photopolymerizable relief printing process is the development of the printing plate after the image is formed through imagewise exposure of the photopolymerizable plate to light. The image is formed by polymerizing and crosslinking of the photopolimerizable material that is exposed while the unexposed portion remains unpolymerized. Ordinarily, development is accomplished by washing the exposed plate in a solvent which can remove the unpolymerized material while leaving the polymerized (cured) material intact. Since such plates can be formed from a variety of materials, it is necessary to match a specific plate with an appropriate solvent. For example, U.S. Pat. No. 4,323,636, U.S. Pat. No. 4,323,637, U.S. Pat. No. 4,423,135, and U.S. Pat. No. 4,369,246, the disclosures of which are incorporated herein by reference, disclose a variety of photopolymer printing plate compositions based on block copolymers of styrene and butadiene (SBS) or isoprene (SIS). These compositions can be utilized to produce printing plates which can be developed by a number of aliphatic and aromatic solvents, including methyl ethyl ketone, toluene, xylene, d-limonene, carbon tetrachloride, trichloroethane, methyl chloroform, and tetrachloroethylene. These solvents may be used alone or in a mixture with a "non-solvent" (i.e. a substance that cannot dissolve unpolymerized materials), for example, trichloroethane with ethanol. In any case, during the development step, the solvent can be applied in any convenient manner such as by pouring, immersing, spraying, or roller application. Brushing, which aids in the removal of the unpolymerized or uncrosslinked portions of the composition, can also be performed to facilitate the processing of the plate.

Similarly, UK 1,358,062 discloses photosensitive compositions consisting of a nitrile rubber with an addition of photopolymerizable tri- or tetra-unsaturated ester derived from acrylic or methacrylic acid combined with an addition polymerization initiator activated by actinic radiation. Plates made from this composition can be developed by organic solvents including aliphatic esters such as ethyl acetate, aliphatic ketones such as acetone, methyl ethyl ketone, d-limonene, halogenated organic solvents, such as chloroform, methylene chloride, CFC 113 or blends of such solvents. Brushing or agitation can be used to facilitate the removal of the non-polymerized portion of the composition.

U.S. Pat. No. 4,177,074 discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition is also used as the polymer layer of a flexographic printing plate and requires processing with such organic solvents as methyl ethyl ketone, benzene, toluene, xylene, d-limonene, trichloroethane, trichlorethylene, methyl chloroform, tetrachloroethylene, or solvent/non-solvent mixtures, e.g., tetrachloroethylene and n-butanol. The composition may also be processed with water-soluble organic solvents in an aqueous basic solution, such as sodium hydroxide/isopropyl alcohol/water; sodium carbonate/isopropyl alcohol/water; sodium carbonate/2-butoxyethanol/water; sodium borate/2-butoxyethanol/water; sodium silicate/2-butoxyethanol/water; sodium borate/2-butoxyethanol/water; sodium silicate/2-butoxyethanol/glycerol/water; and sodium carbonate/2-(2-butoxyethoxy) ethanol/water.

U.S. Pat. No. 4,517,279, the disclosure of which is incorporated herein by reference, discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. That composition, which is also used as the polymer layer of a flexographic printing plate, requires processing by blends of tetrachloroethylene and a non-solvent. The composition may also be processed in mixtures of sodium hydroxide/isopropyl alcohol/water; sodium carbonate/2-butoxyethanol/water; sodium silicate/2-butoxyethanol/water; sodium carbonate/2-butoxyethanol/glycerol/water; and sodium hydroxide/2-(2-butoxyethoxy) ethanol/water.

As can be seen from the foregoing examples of the prior art, the solvents needed for image development will vary depending on the composition of the polymer layer of the plate. The need for different solvent systems is particularly inconvenient, especially if different photopolymer systems are being processed at the same facility. Furthermore, many of the solvents used to develop the plates are toxic or suspected carcinogens. Thus, there exists a real need for solvent systems which can be used with a greater degree of safety. In addition, there exists a need for solvent systems which can be used in a variety of plates. U.S. Pat. No. 4,806,452 and U.S. Pat. No. 4,847,182, the disclosures of which are incorporated herein by reference, disclose solvent developers for flexographic plates containing terpene hydrocarbons such as d-limonene which are effective on a variety of plate types. These terpene hydrocarbon-based developers are also non-toxic. However, they have proven to be hazards in the workplace because of their tendency to spontaneously combust thereby causing fires.

Therefore, commonly assigned U.S. Pat. No. 6,248,502 solves the drawbacks of terpene by using terpene esters as a substitute developing solvent. Because terpene ester has a higher flash point, the fire risk is greatly decreased. However, terpene esters tends to breakdown through repeated distillation which limits the recyclability of the solvent.

The present invention relates to an environmentally friendly developing solvent that offers improvement over the prior art. The solvent comprises methyl esters which have higher flash points when compared to current solvents. For example, d-limonene (a terpene), terpene ester, and methyl ester have a flash points of 120° F., 141° F., and >250° F., respectively. By having a high flash point, methyl esters offers superior safety in addition to low toxicity, reduced cost, and biodegradability. Furthermore, compared developing solvents of the prior art including terpene ester, methyl ester causes less plate swelling. Therefore, more methyl esters (up to 70% by volume) can be used in the developing solvent resulting in faster removal rate of the non-polymerized portion of the plate.

SUMMARY OF THE INVENTION

The present invention comprises solvents for use in the processing of a wide variety of photopolymeric materials used to form photopolymer printing plates. These solvents, which comprise methyl esters either alone or in the presence of other organic materials (co-solvents and non-solvents), can be used with a variety of polymeric systems. The methyl esters are natural products with low toxicity and are relatively safe to use compared with other solvent systems. Methyl esters, it has been discovered, provide a unique combination of reduced cost, improved plate quality, low volatility, improved regulatory compliance, low toxicity, reduced washout time, and biodegradability.

It is, therefore, an object of the present invention to provide a solvent system and a process for the preparation of relief plates crosslinked by photopolymerization, in which the washout time and the drying time are substantially shorter compared with the conventional process solvents, and wherein the relief plates suffer neither excessive surface swelling nor under-washing and are characterized by improved relief depths and sidewall structure.

Another object of the present invention is to provide a process for the preparation of relief plates crosslinked by photopolymerization which is capable of operation without expensive explosion protection.

It is another object of the present invention to provide solvent systems for use with photopolymeric printing plates which overcome the spontaneous combustion problems of the prior art solvent systems.

It is another object of the present invention is to provide solvent systems which minimizes workplace hazards and requires minimal regulatory reporting.

DETAILED DESCRIPTION OF THE INVENTION

The present invention comprises methyl ester solvents for use in photopolymer printing plate processing. The methyl esters, which can be used either alone or in a blended form with co-solvents or non-solvents, can be used to develop a number of different photopolymer printing plates. As used herein, co-solvents are non-methyl ester compounds that can also dissolve the non-polymerized material; and non-solvents are compounds that cannot dissolve the non-polymerized material. Methyl esters has the general formula $RCOOCH_3$, where R can be any organic moiety. A wide variety of methyl esters are suitable for use in the solvents of this invention including, but not limited to, methyl esters of fatty acids with 8–18 carbons.

Mixtures of methyl esters can also be used and may show synergistic effects when compared with a methyl ester used alone. When a combination of two or more methyl esters is used, the resulting blend is often more effective as a solvent than the individual methyl esters. This blend is referred to herein as a MME (Methyl Mixed Ester) solvent.

Various co-solvents (non-methyl ester compounds that can also, by themselves, dissolve the non-polymerized material) and non-solvents (compounds that cannot, by themselves, dissolve the non-polymerized material) can also be employed with the methyl esters and MME according to the invention. Suitable co-solvents include, but is not limited to, n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

The co-solvent should be soluble in the methyl ester or MME, should have suitable dissolving properties towards the non-photolysed (non-polymerized) portions of the plate that are to be dissolved, should have low toxicity and acceptable safety profiles, and should be readily disposable. The co-solvents are used to modify the properties of the solvent blend. This includes, for example, the addition of co-solvents to aid in the removal of the top protective cover skin on the flexographic plate. In addition, several of the co-solvents, such as terpene alcohols, in particular alpha terpineol, serve as stabilizers to prevent the separation of the solvent blend, which can occur at reduced temperatures. This stabilizer property of the co-solvent becomes important when isoparaffinic hydrocarbons are used as the non-solvent and benzyl alcohol is used as a co-solvent to remove the outer layer of the photopolymerizable printing plate since the benzyl alcohol may separate from the methyl esters and paraffinic hydrocarbon mixture. Further, the mixture of methyl esters and co-solvent is often more effective as a solvent than the individual methyl esters by itself.

The non-solvent should be miscible with the methyl ester or methyl esters and the co-solvents, should have acceptable toxicity and safety profiles, and should be readily disposable or recyclable. The non-solvent are typically used as a filler to reduce cost, therefore, recyclability of the non-solvent material is highly desirable. Suitable non-solvents include, but is not limited to, petroleum distillates, such as aliphatic petroleum distillates, naphthas, paraffinic solvents, hydrotreated petroleum distillates, mineral oil, mineral spirits, ligroin, decane, octane, hexane and other similar materials. Isoparaffinic solvents are commercially available in a wide range of volatility and corresponding flash points. The developing solvent of the invention can made with a wide range of commercially available isoparaffinic solvents as its non-solvent base. The following table shows volatilities and properties of commercially available isoparaffinic solvents suitable for use with the invention.

TABLE 1

| Volatility | | | | | |
|---|---|---|---|---|---|
| Flash Point (° F.) | 106 | 129 | 135 | 147 | 196 |
| Initial Boiling Point (° F.) | 320 | 352 | 350 | 376 | 433 |
| 50% Dry Point (° F.) | 331 | 360 | 365 | 383 | 460 |
|  | 345 | 370 | 386 | 405 | 487 |
| Vapor Pressure (mm Hg @ 100° F.) | 14 | 6.2 | 5.7 | 5.2 | 3.1 |

Parameters such as drying rates, fire risk, workplace air quality and volatile organic compound emissions will also play a role in the selected non-solvent choice.

In addition, in a commercially acceptable product, odor masking materials or perfumes are often added. Such odor masking materials or perfumes can include terpenes to impart a clean, fresh odor.

The developing solvent components can be varied but a suitable composition would be about 30–75% by volume of at least one methyl ester and preferably a mixture of methyl esters, about 20–60% by volume of a first co-solvent capable of dissolving the top protective cover layer of the flexographic plate, about 5–35% by volume of a second co-solvent. Optionally less than about 2% by volume of a perfume or odor masking material can be added to the solvent; however, it is important that the perfume must not adversely affect the function of the solvent. A non-solvent can also be included in the solvent in an amount up to about 45% by volume. A preferred composition would be about 50–70% by volume of at least one methyl ester and preferably a mixture of methyl esters, about 20–50% by volume of a first co-solvent capable of dissolving the top protective cover layer of the flexographic plate, about 10–30% by volume of a second co-solvent. A non-solvent can also be included in the preferred mixture in an amount up to about 20% by volume. The preferred co-solvents are 2-ethylhexanol and cyclohexanol; and the preferred non-solvent is an isoparaffinic hydrocarbon. An especially preferred developing solvent comprises 70% methyl hexadecanoate, 20% 2-ethylhexanol, and 10% cyclohexanol.

The methyl ester-based solvents may be substituted for the synthetic hydrocarbon, oxygenated solvents or halogenated hydrocarbon solvents used for processing photopolymer printing plates. For example, the methyl ester solvents are suitable in the processing of photopolymer printing plates based on block copolymers of styrene and butadiene (SBS) or styrene and isoprene (SIS), copolymers of butadiene and acrylonitrile, terpolymers of butadiene, acrylonitrile and acrylic acid and other similar photopolymers. The methyl ester-based solvents can be applied to the plates by any conventional application means including spraying, brushing, rolling, dipping (immersing) or any combination thereof. The methyl ester solvents also produce photopolymer plates with less cured polymer image swelling than those processed in conventional hydrocarbon or chlorinated hydrocarbon solvents. Since swelling tends to distort the image formed, this surprising result permits clear, sharp images to be formed at much lower exposure times than those resulting from the use of conventional solvents. Additionally, the solvents of the invention have fairly low volatility which reduces worker exposure during plate processing. Furthermore, because methyl esters are natural products, they are much less toxic and are more readily biodegradable than synthetic hydrocarbon or chlorinated hydrocarbon solvents.

The following examples are given to illustrate the present invention. It should be understood that the invention is not to be limited to the specific conditions or details described in these examples.

EXAMPLE 1

Plate Preparation

Plates were made of Dupont 112 TDR, a photopolymerizable material. The plate sizes are as follows: plate #1) 24"×52", plate #2) 27"×42", and plate #3) 50"×55". Each plate was exposed on the backside for 95 seconds and on the front for 700 seconds.

EXAMPLE 2

Development

The plates were developed using a solvent blend of about 70% of methyl hexadecanoate, 20% 2-ethylhexanol, and 10% cyclohexanol. The plates were processed at 50 mm per minute processor speed for plates #1 and #2 and 85 mm per minute for plate #2, and at brush pressure of 1 mm down pressure for all three plates.

EXAMPLE 3

Swell and Dry Times

The following tables gave the face and floor thickness of each plate after development with the developer of Example 2 (all measurements were given in ¹⁄1000 inch). The plates measurements were checked at random locations on the plate. The plates were dried to the correct gauge for the plate before final measurements were taken.

TABLE 2

| | Plate #1 | | | | | |
|---|---|---|---|---|---|---|
| | Just before drying | | After 15 min. in plate dryer | | After 40 min. in plate dryer | |
| | Face | Floor | Face | Floor | Face | Floor |
| | 0.118 | 0.056 | 0.115 | 0.052 | 0.114 | 0.042 |
| | 0.117 | 0.056 | 0.114 | 0.040 | 0.113 | 0.030 |
| | 0.118 | 0.048 | 0.114 | 0.036 | 0.113 | 0.037 |
| | 0.117 | 0.034 | 0.117 | 0.043 | 0.115 | 0.038 |
| | 0.117 | 0.040 | 0.116 | 0.049 | 0.112 | 0.046 |
| Average | 0.1174 | .0468 | 0.1152 | 0.0440 | 0.1134 | 0.0386 |

TABLE 3

| | Plate #2 | | | |
|---|---|---|---|---|
| | Just before drying | | After 60 min. in plate dryer | |
| | Face | Floor | Face | Floor |
| | 0.118 | 0.063 | 0.112 | 0.049 |
| | 0.118 | 0.057 | 0.112 | 0.044 |
| | 0.118 | 0.046 | 0.112 | 0.036 |
| | 0.118 | 0.043 | 0.112 | 0.030 |

TABLE 3-continued

Plate #2

| | Just before drying | | After 60 min. in plate dryer | |
|---|---|---|---|---|
| | Face | Floor | Face | Floor |
| | 0.118 | 0.060 | 0.113 | 0.034 |
| | — | — | 0.113 | 0.041 |
| Average | 0.1180 | 0.538 | 0.1123 | 0.0390 |

TABLE 4

Plate #3

| | Just before drying | | After 60 min. in plate dryer | |
|---|---|---|---|---|
| | Face | Floor | Face | Floor |
| | 0.116 | 0.062 | 0.114 | 0.049 |
| | 0.115 | 0.056 | 0.113 | 0.044 |
| | 0.115 | 0.040 | 0.113 | 0.036 |
| | 0.115 | 0.043 | 0.112 | 0.030 |
| | 0.116 | 0.046 | 0.112 | 0.034 |
| | — | — | 0.113 | 0.041 |
| Average | 0.1154 | 0.0494 | 0.1128 | 0.0390 |

The data clearly showed faster drying times when compared to developing solvents of the prior art. The drying times using the methyl ester solvent of Example 2 were less than 60 minutes while typical drying times of prior art solvents were about 90 to 180 minutes. For example, the drying times of the terpene ester solvent disclosed in U.S. Pat. No. 6,248,502 were from 70 to 160 minutes.

The invention has been disclosed broadly and illustrated in reference to representative embodiments described above. Those skilled in the art will recognize that various modifications can be made to the present invention without departing from the spirit and scope thereof

What is claimed is:

1. A method for the development of photopolymerizable flexographic relief printing plates comprising
   selecting a developing solvent, said developing solvent comprising at least one methyl ester; and
   washing an exposed flexographic relief printing plate with said developing solvent to develop and image by dissolving and washing away non-exposed photopolymerizable material.

2. The method of claim 1, wherein the photopolymerizable flexographic relief printing plates is selected from the group consisting of block co-polymers of styrene and butadiene, block co-polymers of styrene and isoprene, co-polymers of butadiene and acrylonitrile, terpolymers of butadiene, acrylonitrile, and acrylic acid.

3. The method of claim 1, wherein the methyl ester is methyl ester of fatty acids with 8–18 carbons.

4. The method of claim 1, wherein the developing solvent further comprising a co-solvent.

5. The method of claim 4, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

6. The method of claim 5, wherein the substituted cyclohexanol is $^4$-ethycyclohexanol.

7. The method of claim 5, wherein the substituted cyclopentanol is 2,3 dimethylcyclopentanol.

8. The method of claim 5, wherein the cyclohexyl substituted alcohol is cyclohexylpropanol.

9. The method of claim 5, wherein the cyclopentyl substituted alcohol is 4-cyclopentylpentanol.

10. The method of claim 1, wherein the developing solvent further comprising a non-solvent.

11. The method of claim 10, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

12. The method of claim 1, wherein the developing solvent further comprising a co-solvent and a non-solvent.

13. The method of claim 12, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

14. The method of claim 12, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

15. The method of claim 12, wherein the methyl ester is present in an amount of about 50–70% by volume, the co-solvent is present in an amount of about 20–50% by volume, and the non-solvent is present in an amount of about 10–30% by volume.

16. The method of claim 1, further comprising drying the flexographic relief printing plate to remove the developing solvent.

* * * * *